(12) United States Patent
Radjassamy

(10) Patent No.: US 6,407,602 B1
(45) Date of Patent: Jun. 18, 2002

(54) POST-SILICON METHODS FOR ADJUSTING THE RISE/FALL TIMES OF CLOCK EDGES

(75) Inventor: Rajakrishnan Radjassamy, Plano, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/005,758

(22) Filed: Nov. 2, 2001

Related U.S. Application Data

(62) Division of application No. 09/620,932, filed on Jul. 21, 2000, now Pat. No. 6,331,800.

(51) Int. Cl.[7] .................................................. H03K 5/12
(52) U.S. Cl. ........................ 327/170; 327/263; 327/566; 326/95; 326/98
(58) Field of Search ................................ 327/170, 108, 327/263, 264, 256, 259, 292, 299, 288, 564–566; 326/83, 95, 93, 98, 102, 103

(56) References Cited

U.S. PATENT DOCUMENTS

| | | | |
|---|---|---|---|
| 5,124,572 A | 6/1992 | Mason et al. ............... 307/269 |
| 5,306,962 A | 4/1994 | Lamb .......................... 307/269 |
| 5,489,860 A | * 2/1996 | Kitagawa et al. ........... 326/103 |
| 5,726,596 A | 3/1998 | Perez .......................... 327/292 |
| 5,760,610 A | * 6/1998 | Naffziger ...................... 326/93 |
| 6,310,499 B1 | * 10/2001 | Radjassamy ................. 327/175 |
| 6,331,800 B1 | * 12/2001 | Radjassamy ................. 327/566 |

* cited by examiner

Primary Examiner—Terry D. Cunningham
Assistant Examiner—Long Nguyen

(57) ABSTRACT

A method for eliminating races commences with the testing of an integrated circuit for races. If a clock signal which is produced by the integrated circuit is deemed to be a cause of races, at least one transistor region is clipped from an output driver of a clock gater which produces the clock signal. The clipping is performed by reconstructing at least one mask which is used to define the output driver during fabrication of the integrated circuit. In a similar fashion, a method for increasing the rise/fall time of clock edges in an integrated circuit commences with the identification of a clock signal with a clock edge having a poor rise/fall time. The rise/fall time of such a clock edge is increased by clipping at least one transistor region from an output driver of a clock gater which produces the clock signal. Once again, the clipping is performed by reconstructing at least one mask which is used to define the output driver during fabrication of the integrated circuit.

3 Claims, 8 Drawing Sheets

POST-SILICON METHODS FOR ADJUSTING THE RISE/FALL TIMES OF CLOCK EDGES

CROSS REFERENCE TO RELATED APPLICATIONS

This is a divisional of application number 09/620,932 filed on Jul. 21, 2000, now U.S. Pat. No. 6,331,800 which is hereby incorporated by reference herein.

FIELD OF THE INVENTION

The invention pertains to the post-silicon adjustment of clock edge rise/fall times, particularly when the adjustment of said rise/fall times tends to influence a deadtime between non-overlapping clock signals and thereby eliminate a race.

BACKGROUND OF THE INVENTION

Many if not most of the integrated circuits which are being produced today comprise some number of clocked logic gates. A clocked logic gate is one which performs its function subsequent to the assertion (or deasertion) of a clock signal.

For example, some logic gates (e.g., some static logic gates) receive a clocked enable signal and cannot perform their intended functions until the enable signal is asserted. Such a clock enabled logic gate 100 is illustrated in FIG. 1.

Other logic gates (e.g., some dynamic logic gates) are alternately precharged and enabled by a clock signal, and can only perform their intended functions during the enable phase of the clock signal. A precharged logic gate 200 is illustrated in FIG. 2 and comprises a precharger 202, a logic block 204 for evaluating a desired logic function, and an inverting buffer 206.

Clocked logic gates 100, 200 are often interdependent on one another. For example, FIG. 3 illustrates a logic pipeline 300 in which data is alternately clocked through stages 304, 308, 312 of the pipeline 300. FIG. 4 illustrates two bodies of logic 402, 404 that generate data which is then combined in a later logic stage 406 (e.g., the two bodies of logic 402, 404 might respectively generate two addends which are input to an adder 406).

In each of the scenarios presented in FIGS. 3 & 4, the interdependence of the clocked logic gates requires an orderly and timely progression of data. Absent an orderly and timely progression of data through the logic pipeline 300 which is illustrated in FIG. 3, or the logic junction 400 which is illustrated in FIG. 4, data flowing through clocked logic gates 100, 200 is likely to be corrupted.

Typically, the orderly and timely progression of data through clocked logic gates 100, 200 is regulated by a pair of out-of-phase clocks. For example, the first of the clocks might cause data to propagate through odd logic stages 304, 312 of a pipeline 300 at multiples of time T, and the second of the clocks might cause data to propagate through even logic stages 308 of the pipeline 300 at multiples of time T+X, where X is not a multiple of T.

Theoretically, clocked logic gates 100, 200 should be able to be clocked with two clocks which are exactly 180° out-of-phase (e.g., clocks CK1 and CK2 in FIG. 5). However, real world conditions such as wire resistance, switching time, capacitance, clock skew, and clock edge degradation often prohibit the alternate clocking of sequential, clocked logic blocks 402, 406 (or logic stages 304, 308, 310) with 180° out-of-phase clocks. The problem with such a clocking scheme is that in many situations, a "race" is possible as soon as pulses of the two clocks start to overlap. A race is a condition in which data tends to propagate through more than one sequential, clocked logic block 402, 406 during a single clock period. Oftentimes, a race occurs as a result of data propagating through two or more sequential memory elements 302, 306, 310 during a single clock period.

Races may take a variety of forms, depending upon the configuration of the clocked logic blocks 100, 200 involved. For example, refer to the logic pipeline 300 illustrated in FIG. 3. If clock CK2N is not de-asserted prior to the assertion of clock signal CK1N, data being processed in LOGIC STAGE_1 can race through LATCH 1 and corrupt necessary data which has yet to be output from LOGIC STAGE_2. With respect to FIG. 4, a race can occur, for example, if new data propagates through LOGIC BLOCK_2 and overwrites the value of DATA_2 prior to the previous and required value of DATA_2 being consumed by LOGIC BLOCK_3.

From the above examples, one can see that when upstream data wins a race and catches up with downstream data, it is very likely that the downstream data will be corrupted. Race prevention is therefore critical to the effective operation of clocked logic gates 100, 200.

One way to prevent races is by alternately clocking sequential, clocked logic blocks 402, 406 with a pair of non-overlapping clocks. Such a pair of non-overlapping clocks is illustrated in FIG. 5 as clocks CK1N and CK2N. Note that between the pulses of each clock there is a "deadtime" during which neither of the clocks is asserted. A first deadtime 502 lies between the falling edge 520 of clock CK1N and the rising edge 516 of clock CK2N, and a second deadtime 500 lies between the falling edge 522 of clock CK2N, and the rising edge 512 of clock CK1N. Since deadtimes 500, 502 are times in which little or no useful work is done, it is important to adjust the deadtimes between non-overlapping clocks so that they are just long enough to prevent races from occurring, but no longer.

One way to produce out-of-phase clocks such as CK1, CK2, CK1N and CK2N (FIG. 5) is via a system 600 of clock gaters 602, 604, 606, 608 (FIG. 6). A clock gater 602, 604, 606, 608 is merely a circuit which receives a first clock signal and outputs a second clock signal, which second clock signal is out-of-phase with the first clock signal in one or more ways. For example, the pulses of the second clock signal may have rising and/or falling edges which are out-of-phase with the rising and falling edges of the first clock signal, or the pulses of the second clock signal may be of shorter or longer duration than those of the first clock signal.

A number of exemplary clock gater circuits are disclosed in U.S. Pat. No. 5,124,572 of Mason et al. entitled "VLSI Clocking System Using Both Overlapping and Non-overlapping Clocks", U.S. Pat. 5,306,962 of Lamb entitled "Qualified Non-Overlapping Clock Generator to Provide Control Lines with Non-Overlapping Clock Timing", U.S. Pat. No. 5,726,596 of Perez entitled "High-Performance, Low-Skew Clocking Scheme for Single-Phase, High-Frequency Global VLSI Processor Clocks", U.S. Pat. No. 5,760,610 of Naffziger entitled "Qualified Universal Clock Buffer Circuit for Generating High Gain, Low Skew Local Clock Signals", and the copending U.S. patent application of Radjassamy entitled "Methods and Apparatus for Adjusting the Deadtime Between Non-overlapping Clock Signals" (Docket No. HP10004258-1). These patents are hereby incorporated by reference for all that they disclose.

The patents of Mason et al. and Lamb disclose a clocking methodology for VLSI circuits which selectively uses the edges of two overlapping clocks and two non-overlapping clocks to eliminate race conditions. The overlapping clocks are used wherever possible to provide superior timing advantages, while the non-overlapping clocks are used to eliminate race conditions as data propagates down a pipeline of transparent registers. The patents of Perez and Naffziger disclose various improvements to the clocking methodologies disclosed in Mason et al. and Lamb.

The patent application of Radjassamy discloses methods and apparatus for easily adjusting the deadtime between non-overlapping clock signals. However, the methods and apparatus disclosed by Radjassamy are particularly suited to pre-silicon deadtime adjustment and race prevention. Pre-silicon is defined herein as that period which is prior to the fabrication of an actual integrated circuit (i.e., the period during which a circuit only exists on paper and/or in simulated environments). Unfortunately, pre-silicon efforts to adjust deadtimes and eliminate races do not always translate to the elimination of races post-silicon (i.e., in an integrated circuit). This is because it is impossible to manufacture an ideal integrated circuit. For example, real world conditions of manufacturing processes often lead to transistor channel widths (and lengths) varying from one part of a channel to another; impurity dopings which vary; sizes and spacings of n-wells and p-wells which vary; and so on. Even when the existence of a manufacturing variance is known, it is sometimes impractical to model the variance pre-silicon. In fact, even ideal conditions cannot always be adequately modeled pre-silicon (e.g., the capacitive contribution of all wire routes in an integrated circuit).

As a result of the above unknowns, some races can only be identified post-silicon. Since a circuit redesign is often costly (or even cost prohibitive) at the post-silicon stage, better and cheaper methods for adjusting the deadtime between non-overlapping clock signals "post-silicon", and for eliminating races "post-silicon", are needed.

SUMMARY OF THE INVENTION

In accordance with the invention, post-silicon methods for adjusting the rise/fall times of clock edges are disclosed herein. The methods are particularly useful for adjusting the deadtimes between non-overlapping clock signals to thereby eliminate races. However, the methods may also be used to adjust the widths of clock pulses, or to otherwise synchronize or time the relationship between two or more clock edges.

A first method is designed to eliminate races and commences with the testing of an integrated circuit for races. If a clock signal which is produced by the integrated circuit is deemed to be a cause of races, at least one transistor region is clipped from an output driver of a clock gater which produces the clock signal. The clipping is performed by reconstructing at least one mask which is used to define the output driver during fabrication of the integrated circuit.

As is well known in the art, a large transistor which appears in a circuit schematic is often constructed by laying out a number of smaller transistor regions in silicon, and then coupling the transistor regions in parallel to form a transistor having the size or strength which is specified in the circuit schematic. Clipping, as the term is used herein, refers to the process of decoupling one or more of these transistor regions so as to reduce the size or strength of a transistor. Although clipping may be performed in a variety of ways, two preferred ways are 1) by fibing a mask which is used to define a transistor region in silicon, or by fibing a mask which is used to couple a transistor region into a larger circuit (i.e., an output driver), or 2) by modifying artwork which is used as a basis for constructing one of the above masks. "Fibing" is a process wherein a focused ion beam (fib) is used to add or remove material to a mask.

A second method is designed to increase the rise/fall time of clock edges in an integrated circuit, thereby providing a means for eliminating races, a means for otherwise adjusting non-overlapping clock signal deadtimes, or a means for adjusting clock pulse widths. The method commences with the identification of a clock signal which has a clock edge with a poor (or inadequate) rise/fall time. When a circuit is designed and/or simulated, clock edges are presumed to transition in a square wave fashion, or with a predefined skew. In the real world, clock edges never transition in a square wave fashion, and edge skew may be more or less than that which was presumed for the purpose of a simulation. Real world clock edges which are skewed to a greater or lesser degree than that which was considered during simulation are therefore defined herein as having a poor rise/fall time. In addition, other factors may lead to a clock edge's rise or fall time being considered poor or inadequate (collectively referred to herein as "poor"). For example, a clock edge may have the amount of skew which it was expected to have pre-silicon, but a manufacturing variance may cause the edge to begin rising or falling at a time which is different than expected. As a result, the timing of a clock edge's rise/fall, in combination with a fast clock edge rise or rail, may lead to the clock edge's rise/fall time being considered poor even though the edge's rise/fall time would have been acceptable had the edge started to rise or fall at the time which was proposed pre-silicon. In any result, a clock edge which is considered to have a poor rise/fall time can be corrected, in accordance with the invention, by clipping at least one transistor region from an output driver of a clock gater which produces the clock signal. The clipping is performed by reconstructing at least one mask which is used to define the output driver during fabrication of the integrated circuit.

These and other important advantages and objectives of the present invention will be further explained in, or will become apparent from, the accompanying description, drawings and claims.

BRIEF DESCRIPTION OF THE DRAWINGS

Illustrative and presently preferred embodiments of the invention are illustrated in the drawings in which.

DESCRIPTION OF THE PREFERRED EMBODIMENTS

Figure 7:
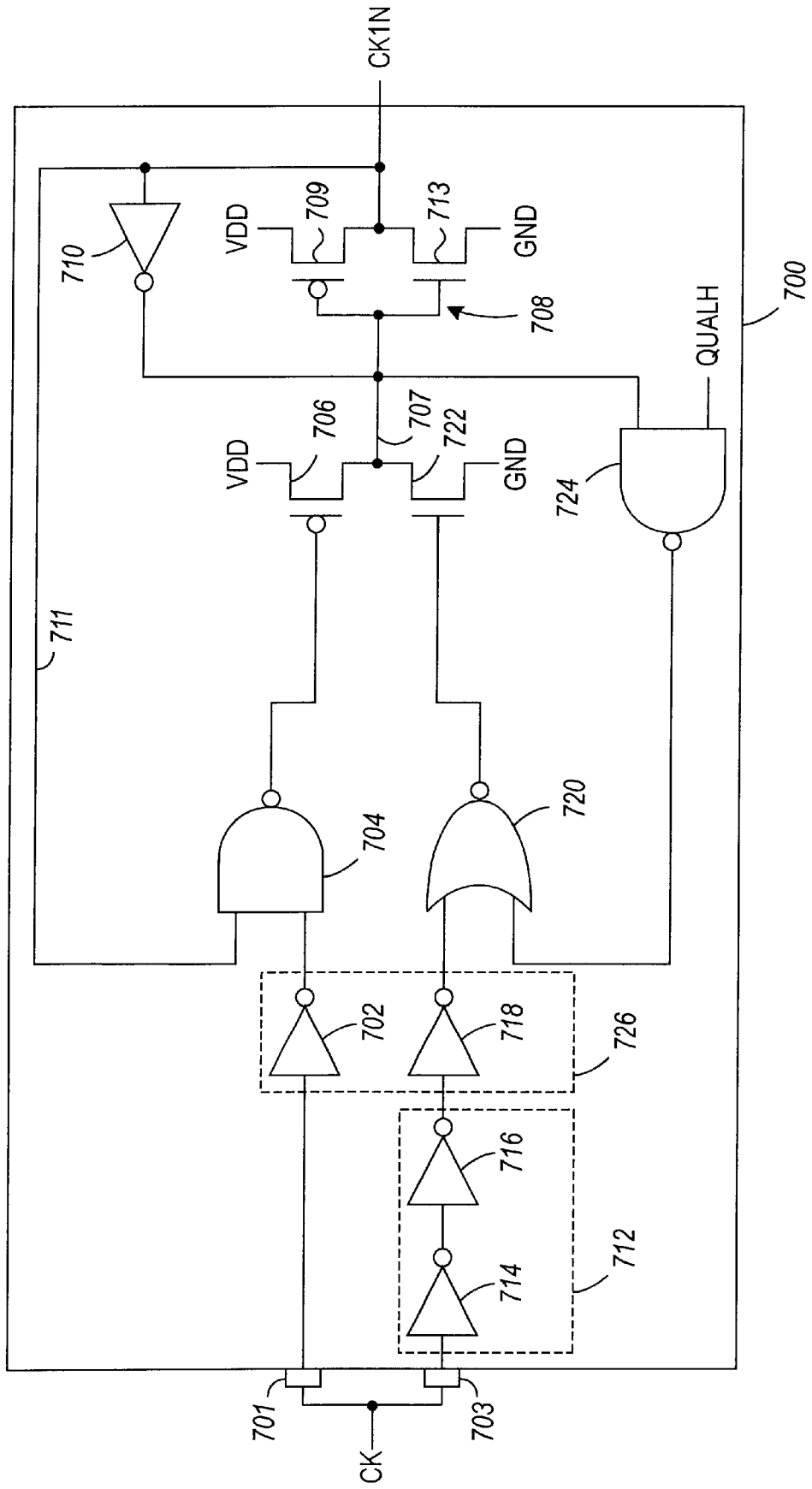
FIG. 7 illustrates a preferred embodiment of FIG. 6's CK1N clock gater circuit.

FIG. 7 illustrates a first preferred implementation of a clock gater 700. Although the clock gater 700 is only one of a plurality of clock gaters which may be modified "post-silicon" in accordance with the invention, this Description will begin with a detailed description of the FIG. 7 clock gater 700 so that one will fully appreciate 1) the problems giving rise to the post-silicon methods which are disclosed in detail later in this Description, 2) the apparatus which is modified by the disclosed post-silicon methods, and 3) the affects of the disclosed post-silicon methods on an exemplary clock gater 700.

1. An Exemplary Clock Gater

The FIG. 7 clock gater 700 generally comprises a falling clock edge generation circuit 702, 704, 706, 708/710. and a rising clock edge generation circuit 714, 716, 718, 720, 722, 708/710, 724. As its name implies, the falling clock edge generation circuit determines the timing of falling clock edges which are produced at the gater's clock output. Likewise, the rising clock edge generation circuit determines the timing of rising clock edges which are produced at the gater's clock output.

The failing and rising clock edge generation circuits each comprise a feed-forward path and a feedback path. The feed-forward path of the falling clock edge generation circuit comprises four components: an inverter 702, a NAND gate 704, a pull-up transistor 706, and a latch 708/710. The feedback path of the falling clock edge generation circuit comprises a simple wire connection 711 between the output of the latch 708/710 and the NAND gate 704. The feed-forward path of the rising clock edge generation circuit comprises five components: an inverter chain 712, an additional inverter 718, a NOR gate 720, a pull-down transistor 722, and latch 708/710. The feedback path of the rising clock edge generation circuit comprises a connection between the input of latch 708/710 and NOR gate 720 through NAND gate 724.

Operation of the falling clock edge generation circuit is as follows. For illustration purposes, it will be assumed 1) that clock signal CK begins low, 2) that clock output CK1N has already transitioned to a low steady state (i.e., logic "0") in response to CK being low, and 3) that the feedback input to NAND gate 704 is at a low state. When clock CK transitions high, the output of inverter 702 transitions low after a delay which is determined by the size of the inverters' component transistors. With both inputs to NAND gate 704 being low, the output of NAND gate 704 remains high, thus failing to drive the gate of pull-up transistor 706. The falling clock edge generation circuit therefore has no affect on clock output CK1N when clock signal CK transitions from low to high.

Now consider the case when clock signal CK transitions from high to low. Prior to CK transitioning low, the rising clock edge generation circuit will have caused clock output CK1N to have transitioned high. As a result, the feedback input to NAND gate 704 will be high prior to CK transitioning low. When clock CK ultimately transitions low, the output of inverter 702 transitions high after a delay which is again determined by the size of the inverters' component transistors. With both inputs to NAND gate 704 being high, the output of NAND gate 704 transitions low. This, in turn, causes PFET (p-type field effect transistor) 706 to conduct, thus pulling node 707 to a high potential. Inverter 708 of latch 708/710 then causes output CK1N to transition low, thereby generating a falling clock edge at output CK1N.

When output CK1N transitions low, a feedback loop 711 provides a low signal to the feedback input of NAND gate 704, thus causing PFET 706 to stop conducting. The gater 700 is thereby set to respond to the next transition of clock signal CK, and a drive fight between the falling and rising clock edge generation circuits can be avoided. Output CK1N is held high by latch 708/710 until clock signal CK once again transitions low.

Operation of the rising clock edge generation circuit of clock gater 700 will now be discussed. Assume once again that clock signal CK begins low, and that clock output CK1N has already transitioned to a low steady state in response to CK being low. Node 707 will therefore be high. If qualifying signal QUALH is also high, then the feedback input of NOR gate 720 will be low. When clock CK transitions high, the output of inverter 718 will eventually transition low after a delay which is determined by the size of the component transistors in inverters 714, 716 and 718. With both inputs to NOR gate 720 being low, the output of NOR gate 720 will transition high and cause NFET (n-type field effect transistor) 722 to conduct. When NFET 722 conducts, node 707 is pulled low, and clock output CK1N rises. Thus, a rising clock edge is generated.

When node 707 is pulled low, NAND gate 724 outputs a high signal to NOR gate 720 (assuming that qualifying signal QUALH still remains high). Thereafter, NFET 722 stops conducting and output CK1N is held high by latch 708/710. Subsequently, clock CK will transition low, after which the output of inverter 702 will transition high after a delay stemming from the propagation of clock signal CK through inverters 714, 716 and 718. With both inputs to NOR gate 720 being high, the output of NOR gate 720 remains low, thereby causing NFET 722 to continue its period of non-conductance. The rising clock edge generation circuit therefore has no affect on clock output CK1N when CK transitions from high to low.

Note that the deassertion of qualifying signal QUALH (i.e., driving QUALH low) serves to disable the clock gater circuit 700. Subsequent to driving QUALH low, a low CK1N will remain low, and a high CK1N will transition low and then remain low. The uses and advantages of such qualifying signals are further described in U.S. Pat. No. 5,760,610 of Naffziger entitled "Qualified Universal Clock Buffer Circuit for Generating High Gain, Low Skew Local Clock Signals".

The clock gater circuit 700 illustrated in FIG. 7 may be easily tuned in several respects. One way to tune the circuit 700 is to resize the component transistors in the inverters 714, 716 forming the inverter chain 712 (perhaps by adjusting the ratios of the transistors in an inverter 714, 716). Doing so leads to the addition or subtraction of delay as a signal propagates through the inverter chain 712. For example, by sizing the channel widths of the transistors of inverter 714 smaller (or by sizing the channel lengths of the transistors larger if the fabrication process so permits), the drive currents through the channels of the transistors are reduced, and thus additional delay is imparted to the propagation of a signal through the inverter 714. Likewise, by sizing the channel widths of the transistors of inverter 714 larger, the drive currents through the channels of the transistors are increased, and a signal will propagate through the inverter 714 more quickly.

As previously discussed, the rising clock edge generation circuit has no influence on output CK1N when signal CK falls. As a result, any delay which is introduced by the inverter chain 712 of the rising clock edge generation circuit only affects output CK1N when signal CK rises. Any delay in the propagation of a rising edge of signal CK, which delay is introduced by the inverter chain 712, results in a more or less corresponding delay in the generation of a rising edge at output CK1N. Adjustments in the inverter chain 712 of the rising clock edge generation circuit therefore lead to adjustments in the timing of rising edges produced at clock output CK1N.

Another way to tune the clock gater circuit 700 illustrated in FIG. 7 is to resize the component transistors of inverter 702. Doing so leads to the addition or subtraction of delay as a signal propagates through inverter 702, and as a result, leads to an adjustment in the timing of falling edges produced at clock output CK1N.

Note that an adjustment to inverter 702, without more, creates a load mismatch between the falling and rising clock edge generation circuits of gater 700, which load mismatch can only be corrected by adjusting one or more inverters 714, 716 in the inverter chain 712. As a result, inverter 718 is provided in the rising clock edge generation circuit. When inverter 702 is adjusted, a similar adjustment can be made to inverter 718 to thereby prevent the afore-mentioned load mismatch. If one only desires to adjust the rising edges 512 of clock CK1N, the use of transistor 718 allows one to do so without affecting other timing and/or loading issues of gater 700.

Figure 5:
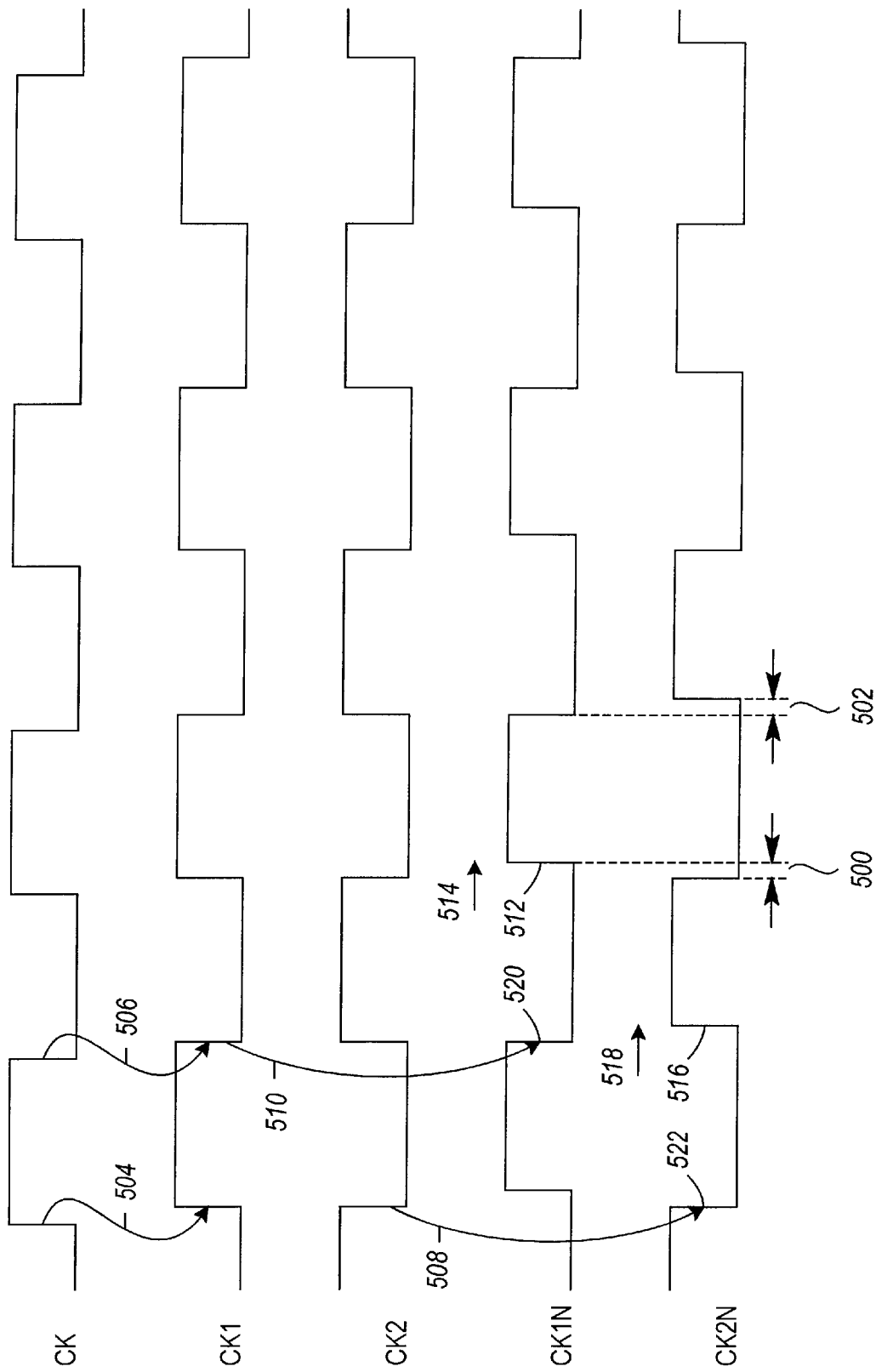
FIG. 5 illustrates a system clock signal, CK, a pair of overlapping clocks, CK1 and CK2, and a pair of non-overlapping clocks, CK1N and CK2N.

Note that the FIG. 7 clock gater circuit 700, standing alone, provides a means for changing the duty cycle of clock signal CK1N by adjusting the timing of rising and falling edges 512, 520 produced at clock output CK1N. However, clock gater 700 is especially useful when it is used to fulfill the function of CLOCK GATER_3 in the FIG. 6 system of clock gaters. In such a role, the FIG. 7 clock gater 700 produces non-overlapping clock signal CK1N (FIG. 5). The afore-mentioned means for adjusting the FIG. 7 clock gater 700 therefore provide 1) a means for adjusting the deadtime 500 between falling edges 522 of clock CK2N and rising edges 512 of clock CK1N, and 2) a means for insuring that falling edges of clocks CK1N and CK1 fall in unison 510.

Figure 1:
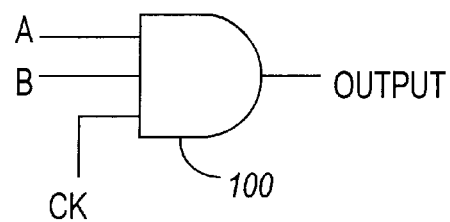
FIG. 1 illustrates a clocked logic gate which is activated by a clocked enable signal.
Figure 2:
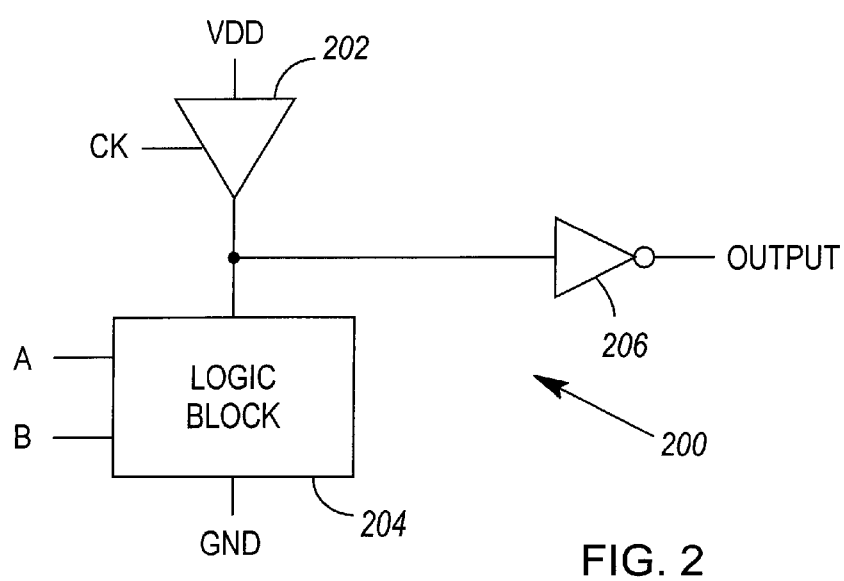
FIG. 2 illustrates a clocked logic gate which is alternately precharged and enabled by a clock signal.
Figure 3:
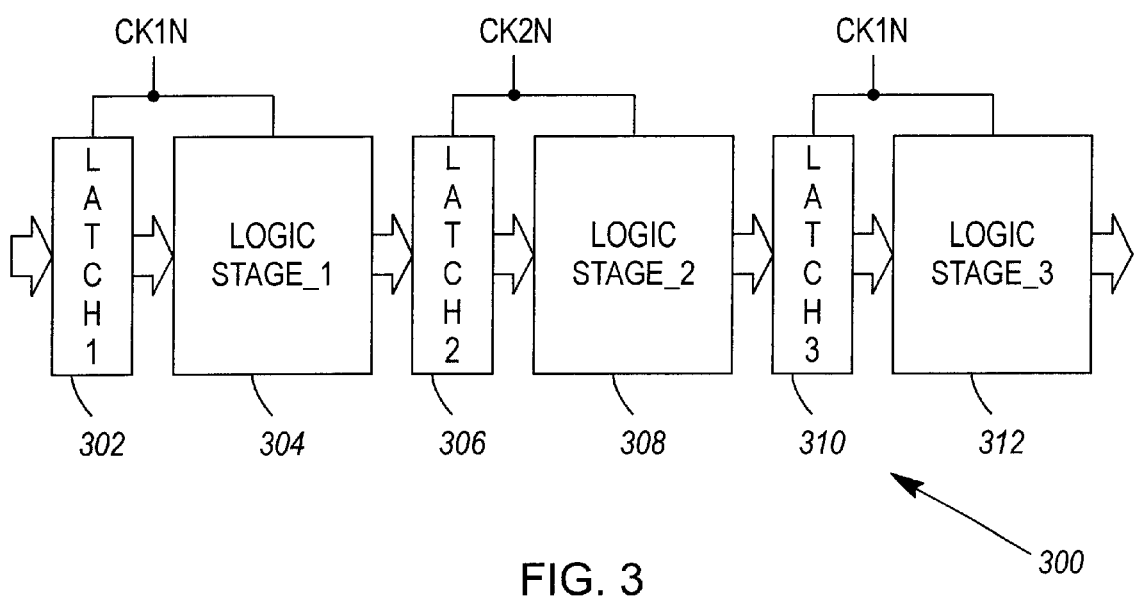
FIG. 3 illustrates a pipeline of clocked logic stages.
Figure 4:
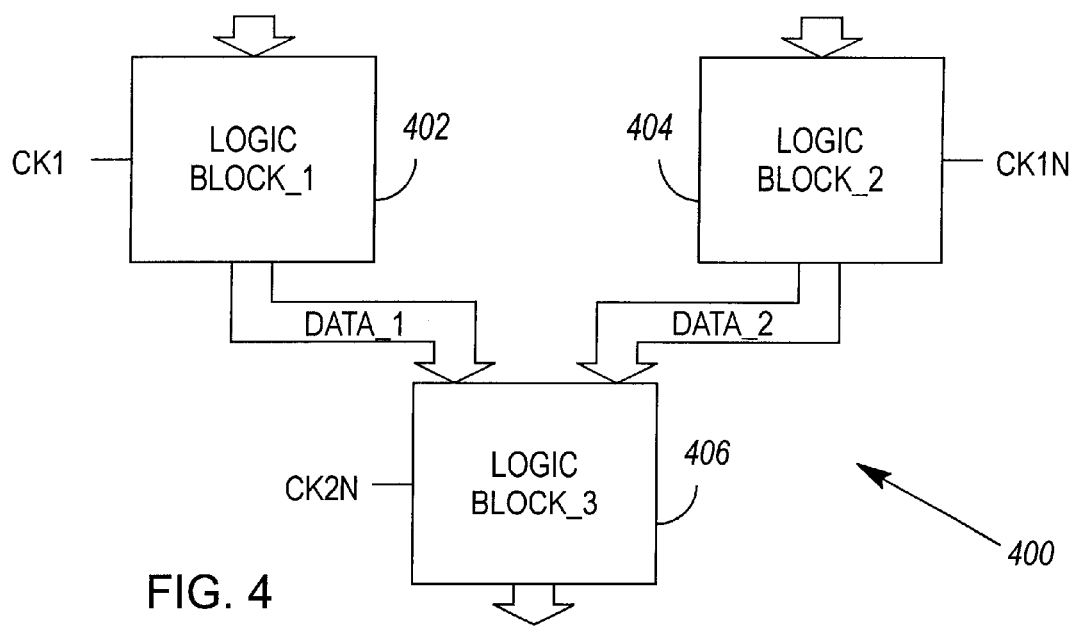
FIG. 4 illustrates two logic blocks feeding a logic junction.
Figure 6:
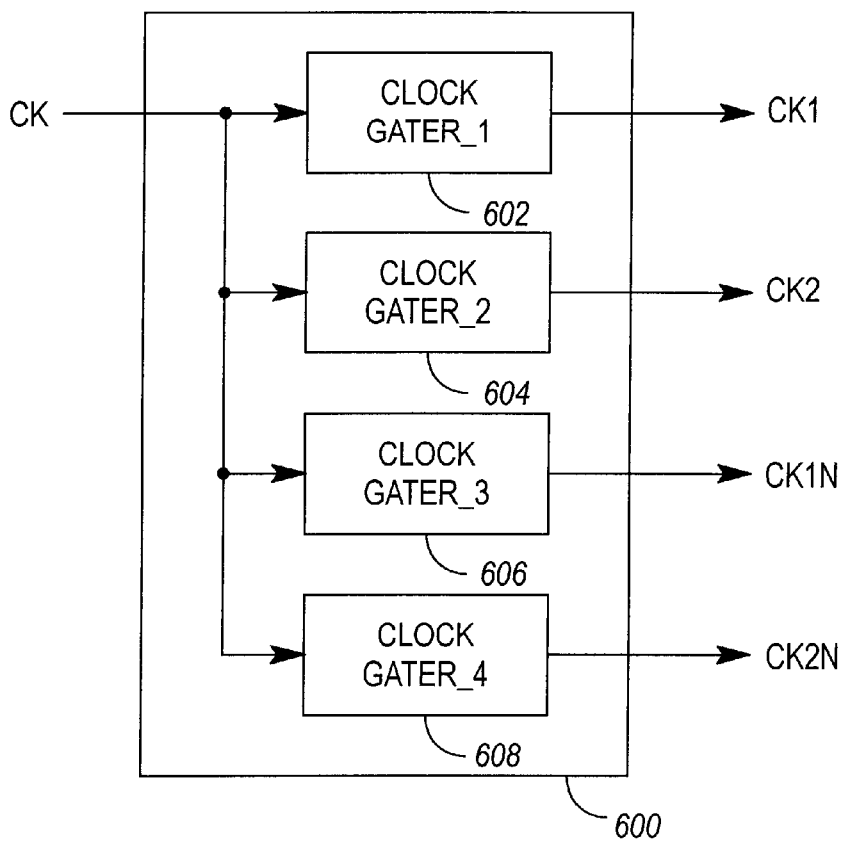
FIG. 6 illustrates a system of clock gaters for producing the CK1, CK2, CK1N and CK2N clocks illustrated in FIG. 5.

Clock gater 700 is preferably tuned to function within the system of clock gaters illustrated in FIG. 6 by first adjusting inverter 702 to insure that falling edges 520 of clock CK1N fall in unison with the falling edges of clock CK1 510, and then adjusting inverter 718 to ensure proper load matching. In light of the function performed by inverters 702 and 718 in this scenario, inverter 702 may sometimes be referred to herein as a falling edge synchronization inverter, and inverter 718 may sometimes be referred to herein as a load matching inverter.

Adjustments in the falling edge synchronization and load matching inverters 726 will lead to some amount of delay being imparted to signals propagating through the rising clock edge generation circuit of FIG. 7, by virtue of inverter 718. An initial timing is therefore established for the rising edges 512 of clock CK1N, and an initial value for the deadtime 500 which exists between the falling edges of clock CK2N and the rising edges of clock CK1N is also established. However, this default deadtime 500 may be more or less than what is needed to prevent races in logic gates being clocked by non-overlapping clocks CK1N and CK2N. The inverters 714, 716 of the inverter chain 712 may therefore be adjusted to add or subtract to the initial value of the deadtime 500.

Figure 8:
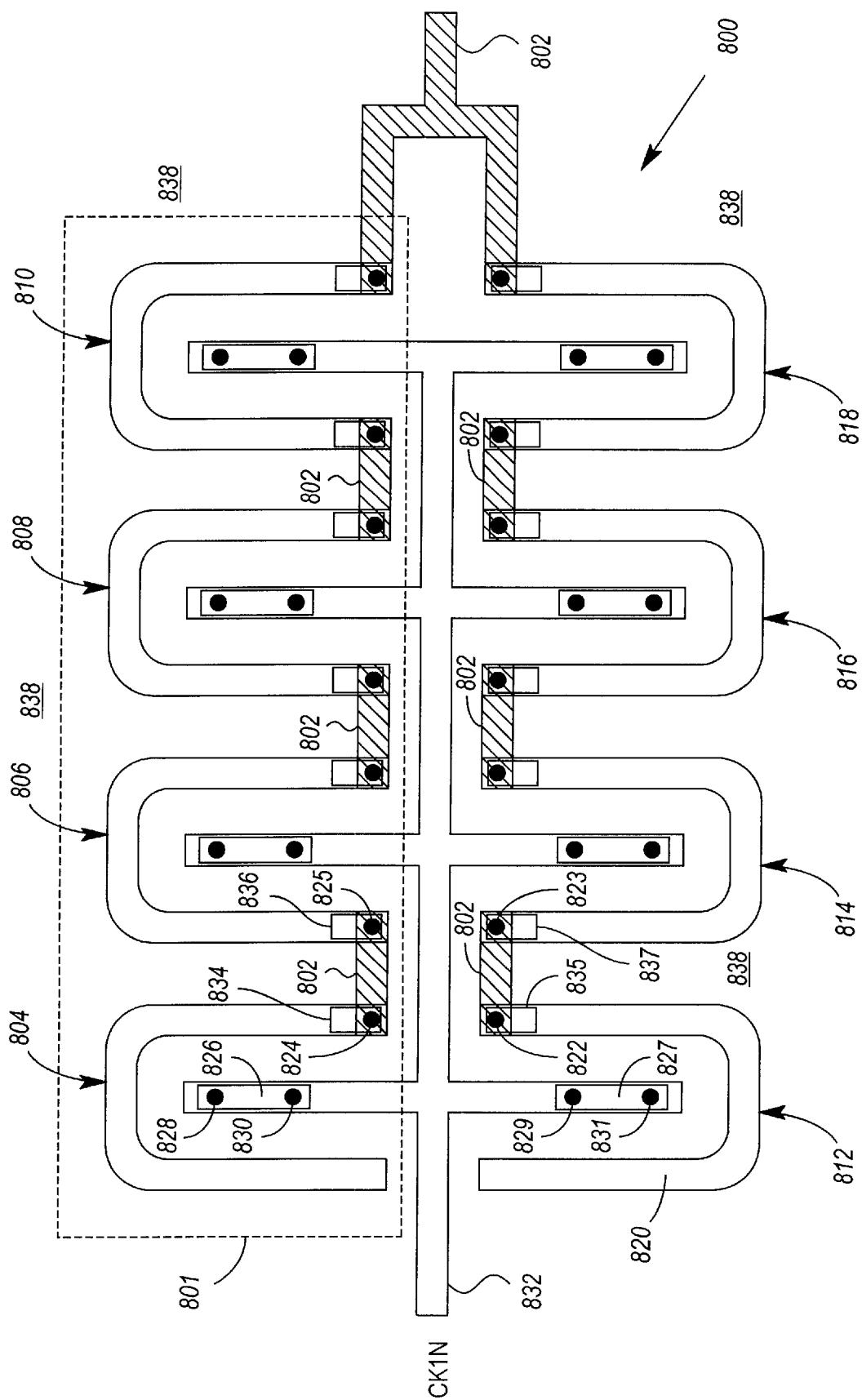
FIG. 8 illustrates exemplary artwork for the FIG. 7 clock gater's output driver.

If the channel widths of the transistors in an inverter 714, 716 of the inverter chain 712 are sized smaller, rising edge 512 will be pushed in the direction of arrow 514 (FIG. 5), thus increasing deadtime 500. For example compare the value of deadtime 500 (FIG. 5) with the value of deadtime 800 (FIG. 8). The greater deadtime 800 which is illustrated in FIG. 8 is due to a re-timing of edges 812. Note, however, that the timing of falling edges 520 remains unchanged in FIG. 8, thus preserving the relationship 510 between the falling edges of clocks CK1N and CK1.

After having adjusted the deadtime between the falling edges 522 of clock CK2N and the rising edges 512 of clock CK1N, and having set the timing for falling edges 520 of clock CK1N, one might also want to adjust the deadtime 502 between the falling edges 520 of clock CK1N and the rising edges 516 of clock CK2N. A clock gater which is in many ways similar to the clock gater 700 illustrated in FIG. 7 may be constructed for this purpose (see, e.g., the U.S. patent application of Radjassamy entitled "Methods and Apparatus for Adjusting the Deadtime Between Non-overlapping Clock Signals" Ser. No. 09/617,373, which was previously incorporated by reference).

2. A Physical Embodiment of a Clock Gater Output Driver

The output driver 708 of clock gater 700 comprises transistors 709 and 713. Transistor 709 is a p-channel field effect transistor (PFET) and produces a rising clock edge 512 of signal CK1N when its gate is driven low. Transistor 713 is an n-channel field effect transistor (NFET) and produces a falling clock edge 520 of signal CK1N when its gate is driven high.

When clock gater 700 is incorporated into an integrated circuit design, the migration from design (pre-silicon) to prototype (post-silicon) is a multi-step process. An early step in the process involves the creation of artwork for an integrated circuit which incorporates clock gater 700. Artwork, as the term is used herein, is a number of patterns which define the placement of components and their interconnections within an integrated circuit. Each pattern defines the placement of components and/or interconnect for a given layer of an integrated circuit. These layers often comprise a doping layer, a polysilicon layer, a local interconnect layer, and a number of metal layers. Artwork also defines insulating and connection layers. For example, the construction of a metal layer on top of a local interconnect layer would result in shorts between the two layers if not for the placement of an insulating and connection layer (e.g., a local interconnect/metal contact layer) between the metal and local interconnect layers.

The appearance of an integrated circuit's artwork is dramatically different from the appearance of an integrated circuit's schematics. Schematics portray components in representative form (such as triangles, circles, etc.). Artwork, on the other hand, is often dominated by variously sized overlapping rectangles. In most cases, a many-to-one correspondence between artwork rectangles and circuit components exists. Whereas a schematic illustrates functionally distinct components, artwork illustrates the physical and spatial placement of component pieces. As a result, a single transistor may be represented in artwork as a number of rectangles representing the placement of gate components, source components, drain components, and interconnect components.

An artwork rendering of an inverter 800 is illustrated in FIG. 8. Note that FIG. 8 illustrates multiple layers of artwork which have been superimposed over one another, as they would be during the manufacture of an integrated circuit.

The FIG. 8 artwork comprises five layers. The first layer (lowest layer) is the doping layer. The doping layer defines an n-type well (n-well 801) within a p-type substrate 838. The second layer is the polysilicon layer. The polysilicon layer defines the transistor gates 820 of a number of transistor regions 804, 806, 808, 810, 812, 814, 816, 818. The third layer is a local interconnect layer which defines a number of transistor region outputs 826, as well as a number of gate contacts (e.g., 834, 835, 836, 837). The fourth layer is a local interconnect/metal contact layer which defines connections 822, 823, 824, 825, 828, 829, 830, 831 between the local interconnect layer and a metal layer. The fifth layer is a metal layer which defines wire routes for the transistor's input 802 and output 832. Note that some of the contacts 822-825 defined by the contact layer serve to connect the transistor input wire route 802 to the gates 820 of the various transistor regions 804-818. Other contacts 828-831 defined by the contact layer serve to connect the transistor region outputs 826 to the transistor output wire route 832.

Once artwork has been created, and it has been confirmed that the artwork is correct, a number of masks corresponding to the number of artwork layers are constructed. A mask is nothing more than a miniaturized representation of an artwork layer, wherein the rectangles and other shapes appearing in the artwork appear as holes in the mask.

Typically, masks are used to directly fabricate an integrated circuit. Each mask, beginning with the mask defining the active layer, is placed over an integrated circuit substrate, and components and/or interconnect defined by the mask are constructed via an appropriate process (e.g., etching, photography, deposition, metallization, etc.).

After application of all of the masks which define an integrated circuit, the integrated circuit is packaged and tested (although some forms of testing may also occur prior to packaging). If testing determines that the timing of a clock signal is leading to a race, steps must be taken to eliminate the race. In the past, this has sometimes led to a circuit redesign and mask reconstruction. Circuit redesign and mask reconstruction can be time-consuming and expensive, especially when one attempts to cure a race by 1) adding delay elements to a clock gater, or 2) sizing elements larger to thereby increase delay (such as by sizing the transistors of inverters 712 larger). Due to the premium placed on integrated circuit real estate, artwork typically minimizes open space in an integrated circuit design. Thus, one's ability to add a component or size a component larger is limited, unless one is willing to undertake (and can afford) a circuit redesign and mask recreation. If a circuit is redesigned, it is possible that an integrated circuit's entire artwork could change. If so, all of a circuit's masks need to be reconstructed (a costly process).

3. Post-silicon Clock Edge Adjustment, Deadtime Adjustment, Clock Pulse Width Adjustment, and Race Prevention For purposes of the following discussion, it will be assumed that the FIG. 8 artwork 800 represents the physical embodiment of the PFET 709 and NFET 713 which form the FIG. 7 clock gater output driver 708.

Figure 11:
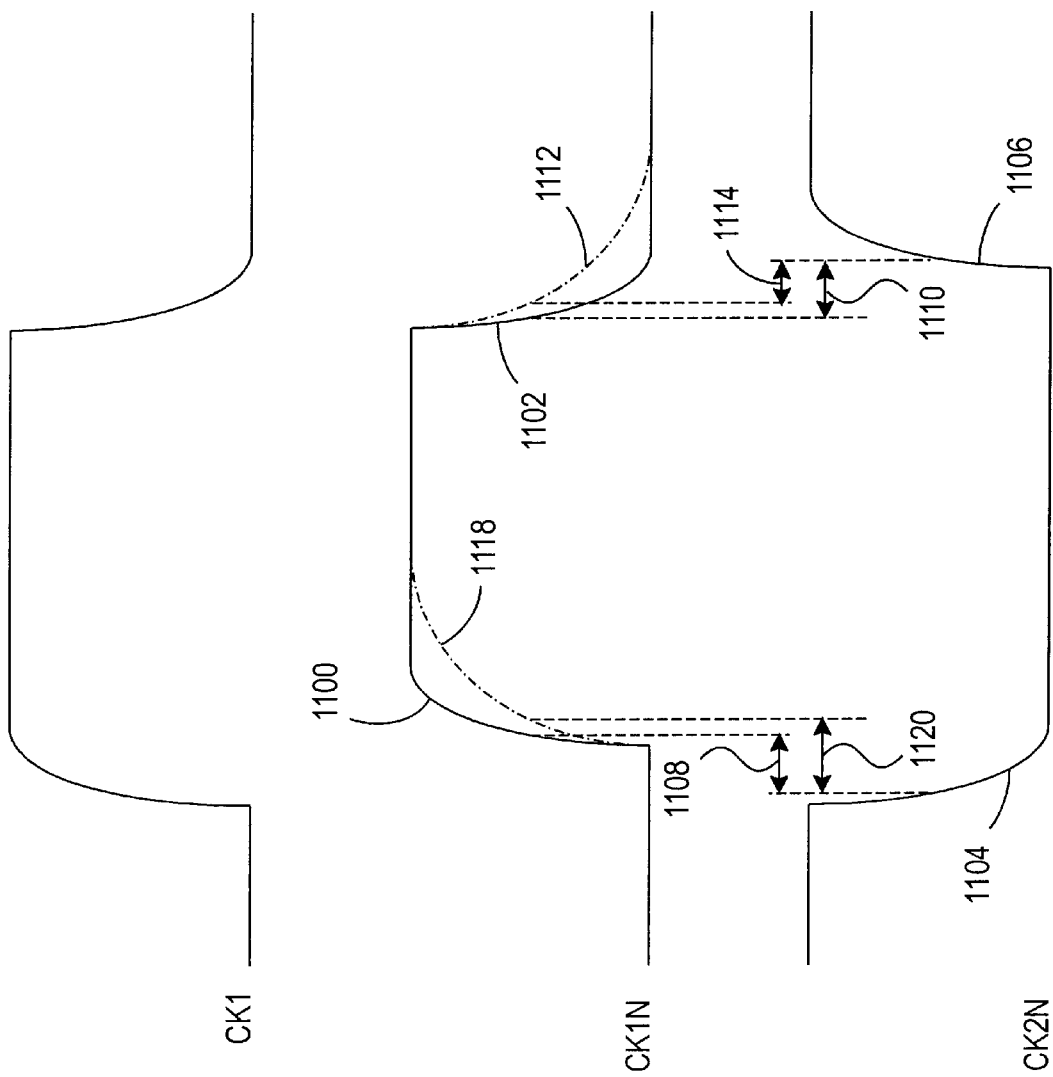
FIG. 11 illustrates various real world clock edges and shows how the clipping of transistor regions from a clock gater's output affects the rise/fall time of these edges.

While the theoretical waveform one might expect the FIG. 7 clock gater 700 to produce is a square wave, the waveform which is produced by physical embodiments of the gater's output transistors 709, 713 will typically comprise edges 1100, 1102 which rise more or less exponentially. As a result, the desired deadtimes 500, 502 illustrated in FIG. 5 tend to become smaller or larger than expected (1108, 1110—FIG. 11). While some degree of variance can be accounted for in the original design of clock gater 700, pressures to maximize a circuit's timing and performance will often limit the number of variations which are accounted for to those that are "probable" and not those which are merely "possible". However, possible variations can and sometimes do occur, and when they do occur, they may not be uniform from one clock gater to another. Thus, different clock edges may rise or fall at different rates, depending upon the manufacturing variations which arise in the particular clock gaters which produce the clock edges.

When clock edges 1100, 1102, 1104, 1106 rise and fall exponentially, a baseline for measuring the deadtimes 1108, 1110 between non-overlapping clock signals must be established. Often, this baseline is chosen to be the 50% height of a waveform (e.g., points at which a 2.5V peak waveform crosses 1.25V). Using such a baseline, one can see that even though the clock edges 1100, 1102, 1104, 1106 of waveforms CK1N and CK2N begin to rise and fall at the times shown in FIG. 11, the deadtime 1108 between falling edges 1104 of clock CK2N and rising edges 1100 of clock CK1N has shrunk, and the deadtime 1110 between falling edges 1102 of clock CK1N and rising edges 1106 of clock CK2N has grown. If deadtime 1108 is determined to cause a race, this deadtime 1108 may be increased by clipping one or more transistor regions 804, 806 from the PFET 709 of the clock gater output driver 708. If FIG. 8 is presumed to illustrate the physical embodiment of PFET 709 and NFET 713, then one circuit 900 which might result from such a clipping is illustrated in FIG. 9.

Figure 9:
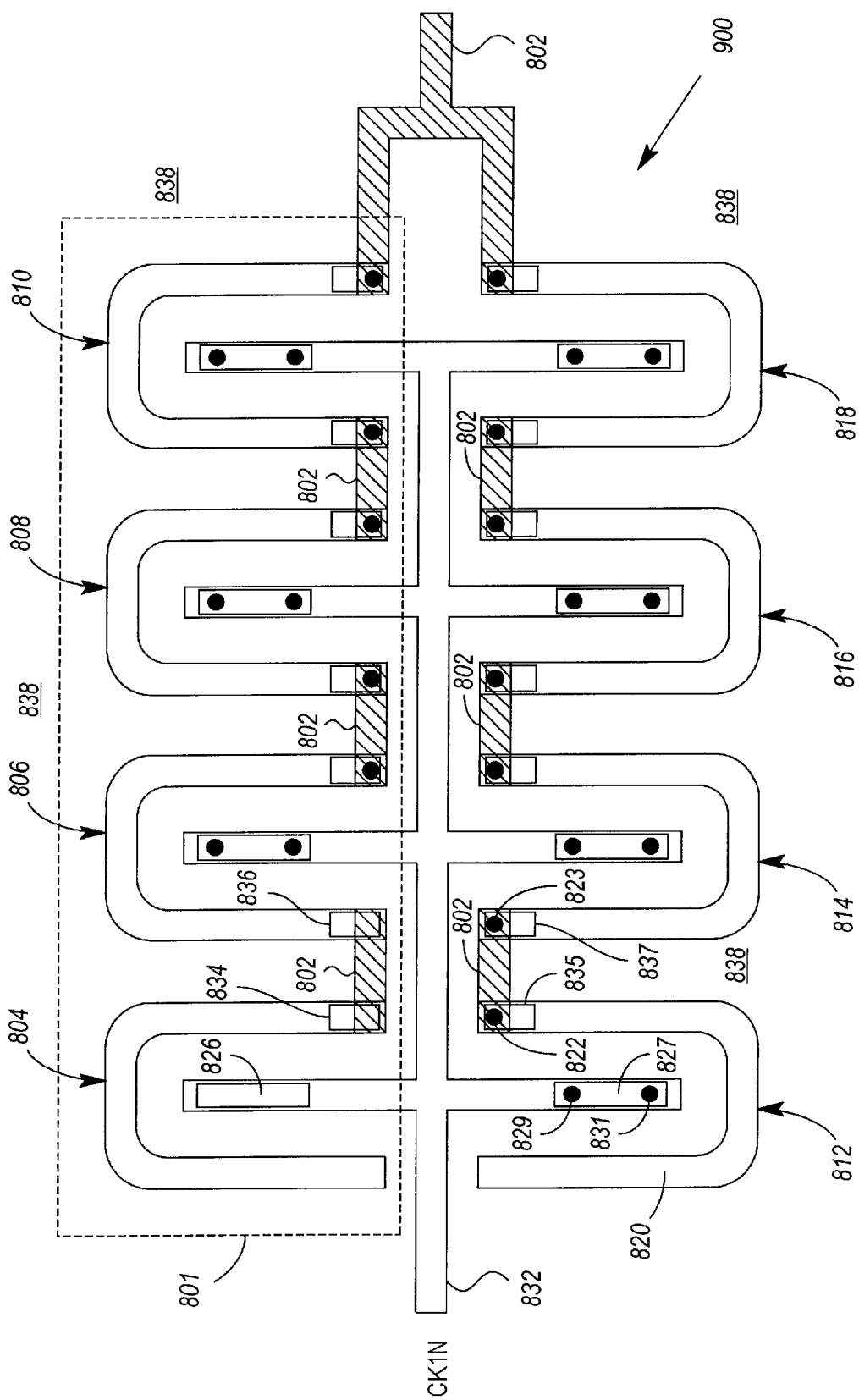
FIG. 9 illustrates a first modification of the FIG. 8 artwork, wherein a PFET transistor region has been clipped from the output driver.

In FIG. 9, PFET transistor region 804 has been clipped by removing contacts 824 and 825, which couple transistor region 804 to input 802, and contacts 828 and 830, which couple transistor region 804 to output CK1N. Contacts 824, 825, 828 and 830 may be removed in a variety of ways, all of which involve a reconstruction of the mask which defines the contacts 824, 825, 828, 830. The preferred way to remove the contacts 824, 825, 828, 830 is via fibing. Fib stands for "focused ion beam". Fibing is a process wherein a fib is used to add or remove material from an object such as a mask. Fibing is advantageous because it can be used to perform very small and precise mask repairs, which is important when one considers that a mask may comprise millions of cut-outs on a surface covering less than one square centimeter. Fibing may be used to fill the mask holes which define contacts 824, 825, 828 and 830.

One may also remove contacts 824, 825, 828 and 830 by modifying the artwork which defines the contacts 824, 825, 828, 830, and then reconstructing the mask which is derived from the artwork. Although this method requires the reconstruction of an entire mask, it requires the reconstruction of only a single mask, and there is no need to regenerate the entire artwork for an integrated circuit and then reconstruct all of the masks for the integrated circuit.

Although FIG. 9 shows one way of clipping a number of transistor regions from an output driver 708 of a clock gater 700, a transistor region may be clipped from an output driver in a variety of other ways. For example, rather than filling the mask holes which define contacts 824, 825, 828 and 830, one could 1) fill a mask cut-out (i.e., hole) which defines the wire route between a transistor region output 826 and a transistor output 832, 2) fill a mask cut-out which defines the gate 820 of a transistor region 812, or 3) fill a mask cut-out which defines a transistor region output 826.

The clipping of one or more transistor regions 804, 806 from an output driver's PFET transistor 709 reduces drive strength and thereby increases a clock edge's rise time. By clipping transistor regions 804, 806 from the PFET 709 of the output driver 708 shown in FIG. 7, the rise time of clock edge 1100 (FIG. 11) is increased so that clock edge 1100 moves to position 1118. As compared to clock edge 1104 of clock signal CK2N, the deadtime 1120 between the rising edge 1118 of clock CK1N and the falling edge 1104 of clock CK2N is increased. As a result, a race which is being triggered by the fast rise of clock edge 1100 might be eliminated if edge 1100 becomes edge 1118.

Figure 10:
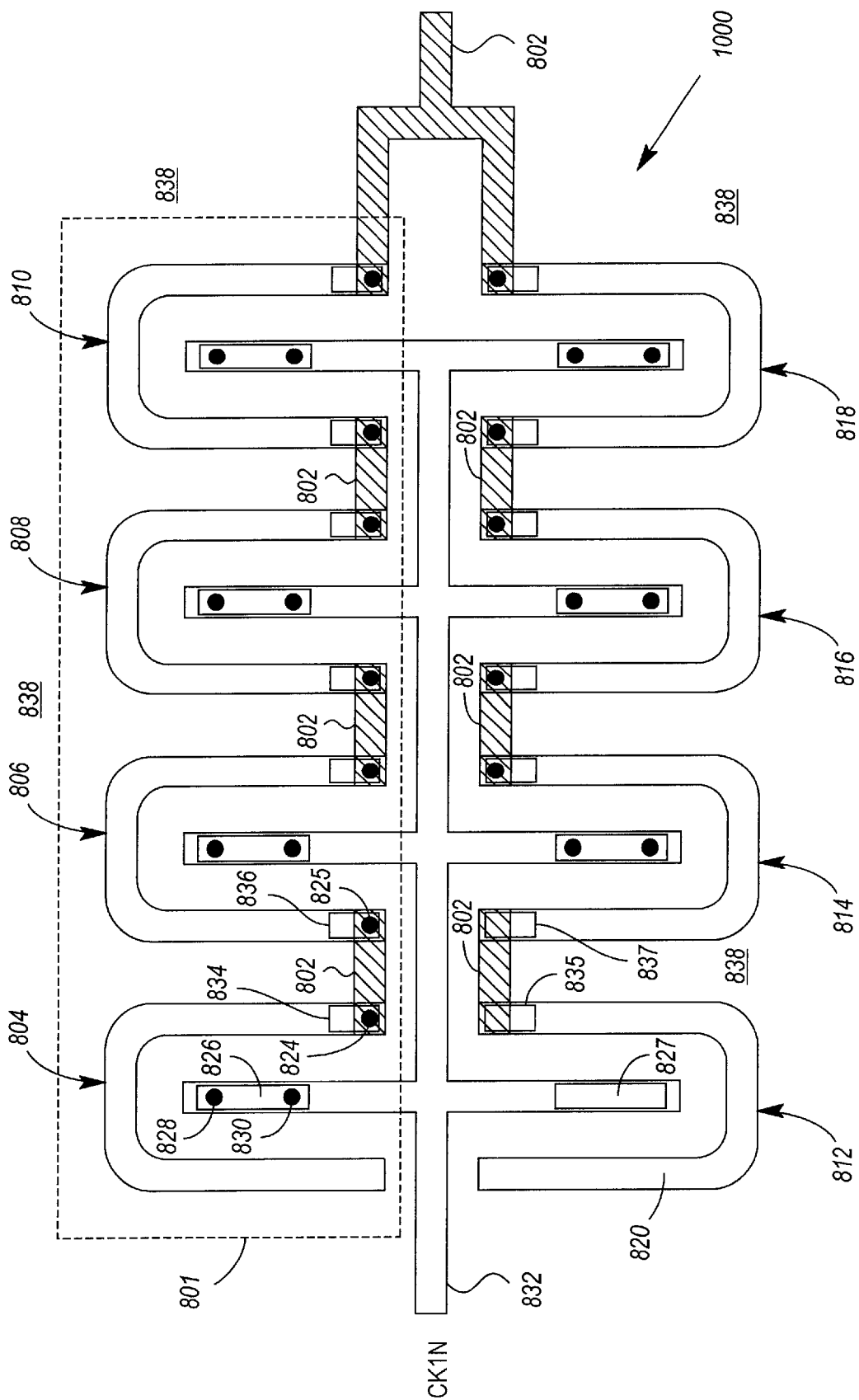
FIG. 10 illustrates a second modification of the FIG. 8 artwork, wherein an NFET transistor region has been clipped from the output driver.

By clipping one or more transistor regions 812, 814 from the NFET 713 of the output driver 708 shown in FIG. 7 (see FIG. 10), the fall time of clock edge 1102 is increased so that clock edge 1102 moves to position 1112. See, for example, the output driver artwork 1000 which is illustrated in FIG. 10, wherein one transistor region 812 has been clipped from NFET 713 by removal of contacts 822, 823, 829 and 831. As compared to clock edge 1106 of clock signal CK2N, the deadtime 1114 between the falling edge 1112 of clock CKlN and the rising edge 1106 of clock CK2N is decreased. While such an adjustment does not necessarily assist in race prevention, such an adjustment might be needed, for example, to ensure that the widths of CK1N clock pulses are sufficient to allow useful work to be done. The methods disclosed herein may therefore be used for clock pulse width adjustment.

Note that while a post-silicon adjustment to the falling edge 1102 of clock CK1N does not help to increase deadtime 1110, a post-silicon adjustment can be made to the rising edge 1106 of clock CK2N for the purpose. Such an adjustment could be made in the same manner that an adjustment to the rising edge 1100 of clock CK1N is made (i.e., by clipping one or more PFET transistor regions from the output driver of the CK2N clock gater 608, FIG. 6).

Although the terms "pre-silicon" and "post-silicon" are used in this Description (and in the following claims), one should understand that these terms are being used as a way to conveniently and respectively refer to 1) a period which is prior to the physical construction of an integrated circuit, and 2) a period which follows the physical construction of an integrated circuit, regardless of whether the integrated circuit is formed on a silicon substrate, GaAs substrate, or any other substrate.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A post-silicon method for increasing the rise/fall time of clock edges in an integrated circuit, comprising:

a) identifying a clock signal with a clock edge having a poor rise/fall time; and b) clipping at least one transistor region from an output driver of a clock gater which produces the clock signal, said clipping being performed by reconstructing at least one mask which is used to define the output driver during fabrication of the integrated circuit.

2. A method as in claim 1, wherein:

a) said output driver comprises:

i) an input and an output;

ii) a number of p-channel field effect transistor (PFET) regions, each PFET region comprising a source, a drain and a gate, wherein said PFET gates are coupled to said input, and said PFET sources and PFET drains couple each transistor region between a first power rail and said output; and iii) a number of n-channel field effect transistor (NFET) regions, each NFET region comprising a source, a drain and a gate, wherein said NFET gates are coupled to said input, and said NFET sources and NFET drains couple each transistor region between a second power rail and said output; and b) said clipping comprises clipping at least one NFET region from said output driver.

3. A method as in claim 1, wherein:

a) said output driver comprises:

i) an input and an output;

ii) a number of p-channel field effect transistor (PFET) regions, each PFET region comprising a source, a drain and a gate, wherein said PFET gates are coupled to said input, and said PFET sources and PFET drains couple each transistor region between a first power rail and said output; and iii) a number of n-channel field effect transistor (NFET) regions, each NFET region comprising a source, a drain and a gate, wherein said NFET gates are coupled to said input, and said NFET sources and NFET drains couple each transistor region between a second power rail and said output; and b) said clipping comprises clipping at least one PFET region from said output driver.

\* \* \* \* \*